United States Patent
Kari

(10) Patent No.: US 6,434,168 B1
(45) Date of Patent: Aug. 13, 2002

(54) DATA COMPRESSION ON A DATA CONNECTION

(75) Inventor: Hannu Kari, Veikkola (FI)

(73) Assignee: Nokia Telecommunications Oy, Espoo (FI)

( * ) Notice: Subject to any disclaimer, the term of this patent is extended or adjusted under 35 U.S.C. 154(b) by 0 days.

(21) Appl. No.: 09/202,203

(22) PCT Filed: Jun. 3, 1997

(86) PCT No.: PCT/FI97/00345
§ 371 (c)(1),
(2), (4) Date: Dec. 7, 1998

(87) PCT Pub. No.: WO97/48212
PCT Pub. Date: Dec. 18, 1997

(30) Foreign Application Priority Data

Jun. 7, 1996 (FI) .................................................. 962381

(51) Int. Cl.⁷ .................................................. H04J 3/00
(52) U.S. Cl. ...................................... 370/521; 348/568
(58) Field of Search ...................... 370/521; 379/93.08; 710/68; 709/247; 348/439.1, 14.13, 568

(56) References Cited

U.S. PATENT DOCUMENTS

| | | | |
|---|---|---|---|
| 5,396,228 A | | 3/1995 | Garahi |
| 5,452,287 A | | 9/1995 | DiCecco et al. |
| 5,867,114 A | * | 2/1999 | Barbir .................. 341/107 |
| 5,884,269 A | * | 3/1999 | Cellier et al. ............. 704/501 |
| 5,933,104 A | * | 8/1999 | Kimura .................. 341/87 |
| 5,956,504 A | * | 9/1999 | Jagadish et al. ........... 707/101 |
| 5,974,179 A | * | 10/1999 | Caklovic ................ 382/232 |
| 5,974,471 A | * | 10/1999 | Belt ...................... 710/1 |
| 6,002,719 A | * | 12/1999 | Parvulescu et al. ......... 375/240 |
| 6,151,627 A | * | 11/2000 | McBride et al. ........... 709/224 |
| 6,175,386 B1 | * | 1/2001 | Van De Schaar-Mitrea et al. ............................... 348/563 |

FOREIGN PATENT DOCUMENTS

| EP | 595 406 | 5/1994 |
|---|---|---|
| WO | 94/14273 | 6/1994 |
| WO | 95/02873 | 1/1995 |

OTHER PUBLICATIONS

V. Jacobson, Compressing TCP/IP Headers for Low–Speed Serial Links (Request for Comments: 1144) (Feb. 1990); pp 1–25.

* cited by examiner

Primary Examiner—Wellington Chin
Assistant Examiner—Brenda Pham
(74) Attorney, Agent, or Firm—Pillsbury Winthrop LLP

(57) ABSTRACT

The invention relates to compressing and transmitting data on a connection between two parties in a telecommunication system comprising at least one slow transmission channel, such as the air interface Um of the radio network. The data to be transmitted are assembled into frames (F) comprising a header section (1) and a data section (2). Prior to transmission, at least the header (1) or the data section (2) of at least some of the frames (F) are compressed. The transmitting party has available at least two different compression algorithms and the receiving party has available at least two different decompression algorithms. The transmitting party compresses at least one section (1, 2) of at least some of the frames (F) with at least two different algorithms, and transmits the frame (F) compressed with the algorithm that produced the best compression ratio.

17 Claims, 2 Drawing Sheets

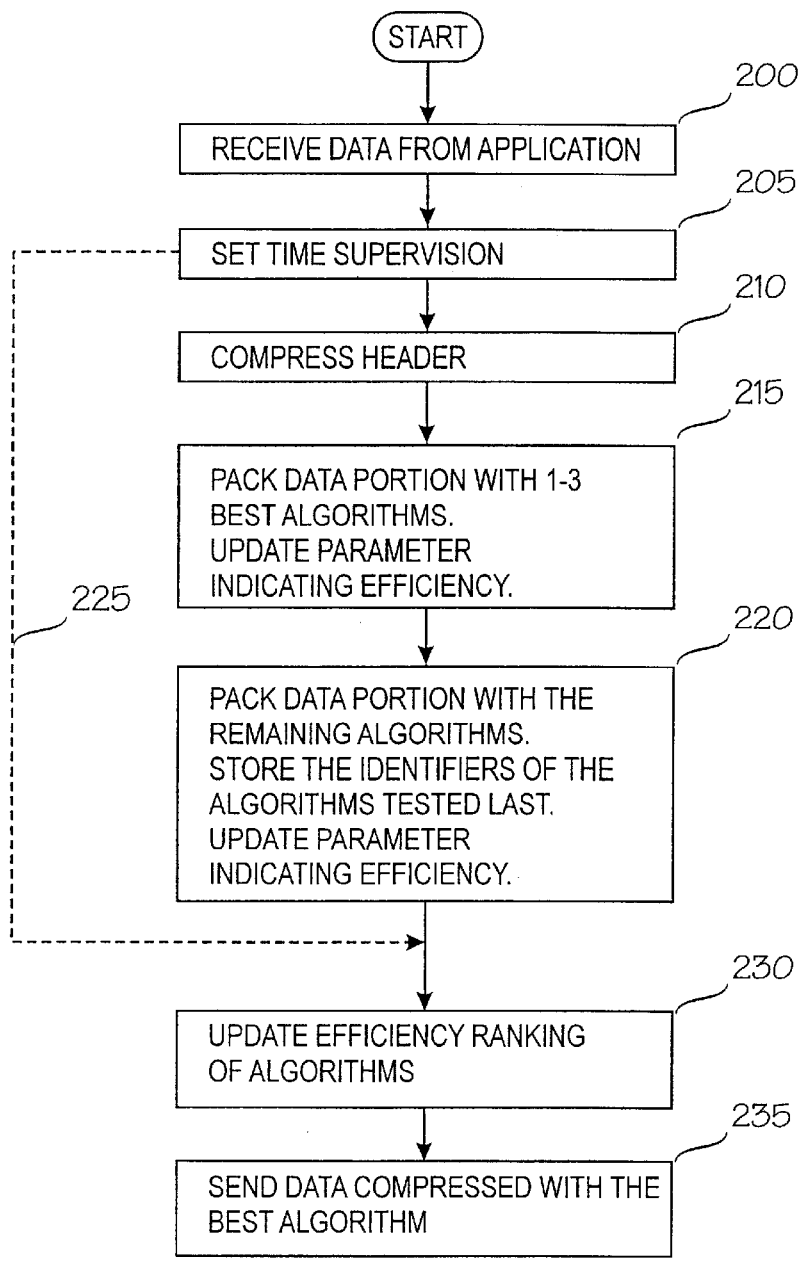

DATA COMPRESSION ON A DATA CONNECTION

This application is the national phase of international application PCT/FI97/00345 filed Jun. 3, 1997 which designated the U.S.

BACKGROUND OF THE INVENTION

The invention relates to improving the capacity of data transfer in a communication system, or more specifically a mobile communication system.

FIG. 1 shows, from the point of view of the invention, the essential parts of a cellular mobile communication system. Mobile stations (MS) communicate with base transceiver stations (BTS) over an air interface Um. The base stations are controlled by base station controllers (BSC) which are connected to mobile switching centers (MSC). A subsystem under control of a base station controller BSC, including the base stations BTSn it controls, is commonly referred to as a base station subsystem (BSS). The interface between the mobile switching center MSC and the base station subsystem BSS is referred to as an A-interface. The part of the mobile communication system at the MSC side of the A-interface is referred to as a network subsystem (NSS). Correspondingly, the interface between the BSC and the BTS is referred to as an Abis interface. The mobile switching center MSC handles the connecting of incoming and outgoing calls. It performs functions similar to those of an exchange of a public switched telephone network (PSTN). In addition to these, it also performs functions characteristic of mobile communications only, such as subscriber location management, jointly with the subscriber registers VLR and HLR of the network. As an alternative to the circuit switched connection described above, the connection to the mobile station MS may also take place via a packet network GPRS (General Packet Radio Service).

One of the growing fields of application for mobile stations is to establish data links in connection with portable computers. Such a computer is represented by the computer PC in FIG. 1. The computer PC and the mobile station MS may be separate units or they may form an integrated whole. The data to be transmitted on data links is assembled into frames (F) that typically contain a header section 1 and a data section 2. If an increase occurs in the number and/or use of mobile stations, a bottleneck will be met in the form of the transfer capacity of the air interface Um. The transfer capacity of the air interface may be increased by compressing the data to be transmitted over the air interface. The compression is based on some bit patterns in the data stream being frequent and some occurring only once. The bit patterns which occur frequently may be sent only once as a whole, and later it is possible to send only a reference to the bit pattern sent earlier. A number of such compression algorithms has been developed,-including RLE (Run Length Encoding) and LZ (Lempel-Ziv) with its different variants, JPEG, MPEG etc. Within the scope of this application, compression ratio of an algorithm refers to the ratio between the length of an uncompressed bit string (e.g. a frame) and the length of the bit string compressed with the algorithm in question.

The conventional packet communication described above encounters the problem that data of a specific type may be compressed more efficiently with a particular compression algorithm whereas data of some other type may be compressed more efficiently with another algorithm. Also such bit patterns exist that cannot be compressed with any algorithm, whereby the identifier indicating the algorithm used just adds to the length of the bit string. A further problem with the prior art compression carried out with a fixed algorithm is that is does not offer optimal protection against eavesdropping because the algorithm does not change.

For example, PCT application WO 94/14273 discloses a system for compressing data to be transmitted with a number of different compression means. However, the WO 94/14273 application mainly relates to transmission of video information to several receivers simultaneously. Because the same information is transmitted to several receivers, such a system does not comprise a bottleneck comparable to the air interface of a cellular packet radio network wherein unique information is transmitted between each pair of transmitter and receiver. Also the WO 94/14273 application assumes that the best compression method can be determined by the contents of the transmitted information. This assumption may be correct if it is known before transmission that the information will be video information.

BRIEF SUMMARY OF THE INVENTION

It is consequently the object of the invention to develop a method by means of which the limited capacity of the air interface or another low-speed telecommunication resource may be utilized as efficiently as possible, thereby simultaneously enhancing traffic encryption against unauthorized listening. The objects of the invention are achieved by a method which is characterized by that which is set forth in the independent claims. The preferred embodiments of the invention are set forth in the dependent claims.

The invention is based on the notion that in a general case, when the contents of the data to be transmitted may be arbitrary, the most efficient compression algorithm can be established only experimentally. Because of this, the data to be transmitted are, according to the invention, compressed with a number of different algorithms, and the best of the compression results is transmitted to the receiving party. The invention is further based on the view that it is worth while in a telecommunication system which contains a slow telecommunication resource, such as an air interface limiting the capacity, to carry out a lot of extra computation in a location where that is cheap and where capacity enlargements may result from such an action.

The method according to the invention utilises the bandwidth of the bottleneck (such as the air interface in a telecommunication system) in the most effective manner possible because the compression algorithm is selected on the basis of actual testing between different algorithms. The method is applicable to several types of telecommunication systems. The method according to the invention may be used adaptively so that the transmitting party learns to apply a specific algorithm on a specific connection. A further advantage of the inventive method is provided by improvements regarding the protection of telecommunication as an eavesdropper will have difficulties in interpreting a message whose compression algorithm may change in the middle of the connection, even between successive packets.

BRIEF SUMMARY OF THE FIGURES

In the following, the invention will be described in closer detail in connection with its preferred embodiments and with reference to the accompanying drawings in which:

FIGS. 2A and 2B illustrate the steps of the inventive compression.

DETAILED DESCRIPTION OF THE INVENTION

Figure 1:
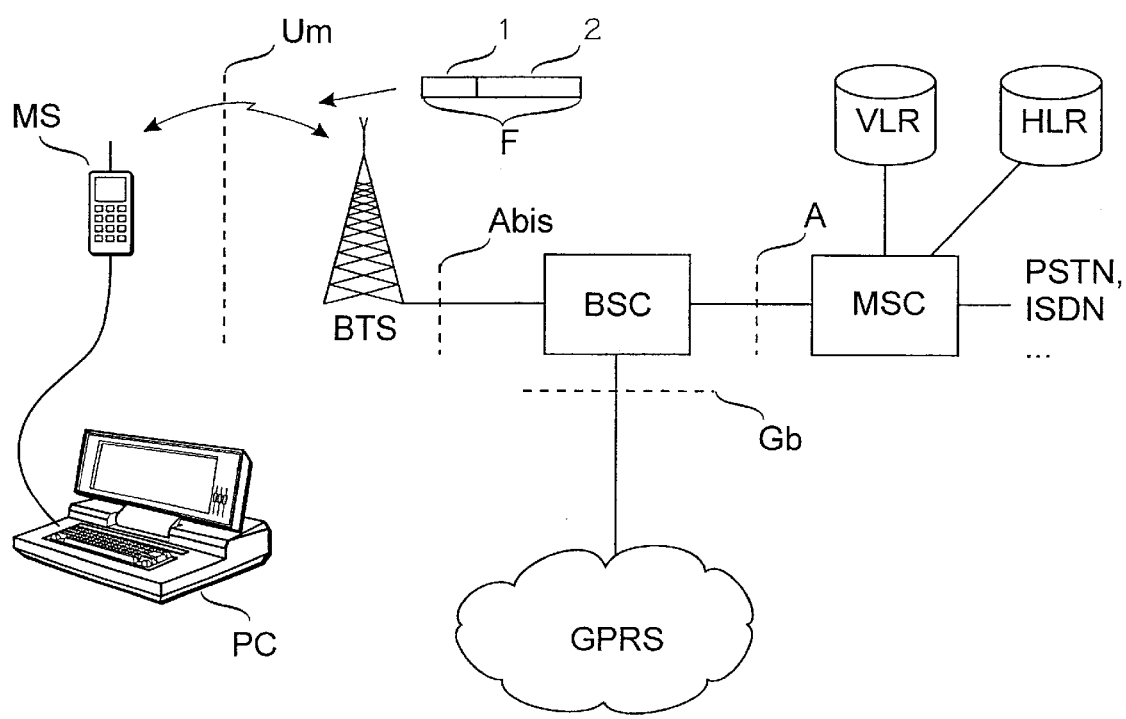
FIG. 1 shows the parts of the mobile communication network that are significant to the invention.

With reference to FIG. 1, the invention will be described in an environment in which there is a mobile station MS and a computer PC connected thereto at the first end of the transmission channel, and at the other end a network subsystem NSS of which is shown a base station BTS, a base station controller BSC and a mobile switching center MSC. To keep the description simple, it is assumed that the compression and decompression algorithm according to the invention is implemented in the MS, but it may equally well be implemented in the PC. The preferred embodiment of the invention relates to enhancing the traffic that takes place over the air interface Um, but in place of the air interface there may also be some other transmission channel having a limited capacity.

In its simplest form, the invention may be applied so that a fixed set of compression and decompression algorithms are implemented in the mobile station MS and the network subsystem NSS. This set of algorithms is the same in the MS and the NSS. The transmitting party compresses each frame F with each algorithm it knows, and selects the algorithm that yields the best compression ratio. In addition, the transmitting party inserts an information field in the frame to be transmitted, indicating which algorithm the data have been compressed with. On the basis of this information field, the receiving party will know which algorithm to use in order to decompress the data.

This simple implementation has at least two problems. Firstly, when using different equipments, the transmitting and receiving parties do not know in advance which algorithms have been installed at the counterpart. In addition, it is not possible to add new algorithms in the system without simultaneous updating of all the equipments in the system. Secondly, compressing each frame with all possible algorithms considerably increases requirements for computation capacity. The first of the problems may be solved by a negotiation protocol between the transmitting and receiving parties. The latter problem may be solved by optimizing the compression procedure, e.g. by making it adaptive.

In a mobile communication system, it could in principle be speculated that the negotiation for finding out the capabilities of the parties is unnecessary and that the features of each mobile station could be stored in a home location register or a similar equipment register. This arrangement would involve a lot of problems, the biggest of which probably having to do with the GSM type of systems maintaining the subscriber location by means of SIMs (Subscriber Identity Modules). If a SIM is shifted to another, for example a rented, terminal equipment, the system will assume that the second terminal equipment has the same capabilities as the original one. This assumption is not necessarily correct.

For this reason, it is better to identify the capabilities of the transmitting and receiving parties at the beginning of the communication. In mobile communication systems, the negotiation must be carried out anew when the mobile station roams to a new area. A suitable and simple negotiation protocol is, for example, such that when taking new algorithms in use they are issued a running number, and at the beginning of the connection or in association with a location area change the calling equipment transmits an inquiry to the called equipment, concerning the available algorithms, to which the called equipment responds by sending a bitmap in which a bit set at an algorithm means that the algorithm is available. According to an alternative negotiation protocol, the calling equipment transmits a short test message compressed with all the algorithms being tested, and the called equipment responds with an affirmative acknowledgment if it is capable of decompressing the message, and if it is not, with a negative acknowledgment. If there is installed, for each compression algorithm, both a compressing and a decompressing algorithm in the transmitting party as well as the receiving party, the common capabilities of the transmitting party and the receiving party may be identified so that e.g. the calling equipment identifies the capabilities of the called equipment. It is unnecessary for the called equipment to identify the capabilities of the calling equipment as the latter cannot have capabilities other than those it has already inquired of the called equipment.

On the other hand, it is mathematically considerably simpler to decompress a packet than to compress it. This holds particularly well true regarding compression of live video images and fractal algorithms, especially. Consequently, it could also be conceivable to implement e.g. in mobile stations a larger number of algorithms for decompressing a packet than for compressing it. In such a case, the negotiation protocol may be supplemented so that also the called equipment identifies the capabilities of the calling equipment.

For an efficient compression of data, the compression must take place prior to encryption and splitting the data into frames. According to an embodiment of the invention, the header sections 1 of the frames F are compressed with a specific type of algorithm and the data sections 2 of the frames F are compressed with at least two different algorithms of which the one is selected that provides the best compression ratio. The header section is compressed with an algorithm optimized for this purpose, said algorithm being substantially the same from one frame to another.

For example, when transmitting user-entered characters in TCP/IP frames in a Telnet connection, each character entered is normally sent in its own frame. This is because the user awaits a relatively quick response, after no more than approximately 0.2 seconds from entering the character. On the other hand, the transmitting program does not know at which moment the next entering is to take place, which means that each character has to be sent as a separate frame consisting of 40 bytes of header and 1 byte of data. The reference [1] discloses a method for compressing the header sections of TCP/IP frames into 3–5 bytes. The method according to the reference [1] utilizes the fact that in the header sections of TCP/IP frames a lot of information is sent that the receiving party is able to form by itself on the basis of the header section in the previous frame. Similar redundancy is present e.g. in header sections of ATM cells.

The compression algorithm employed may be indicated to the receiving party for example by transmitting, in each compressed frame F, an identifier indicative of the compression algorithm used. Alternatively, the receiving party may be sent information on the change in the compression algorithm. This information may be a separate frame, or a field or a peculiar bit pattern inserted to a frame normally transmitted.

To utilize the air interface as efficiently as possible, it is advantageous to carry out the compression procedure during those moments when the transmitting party for a reason or another may not transmit. In the GSM system, for example, the data are transmitted over the air interface as bursts in TDMA timeslots. Between the bursts, the transmitting party can perform the necessary computations and thus utilize its computation capacity that it would otherwise waste just waiting for the next timeslot. At the allocated timeslot, it is possible to interrupt the compression and to transmit the frame compressed with the algorithm that up to that point has produced the best result.

The following discusses various options for reducing the computation requirements. The compression procedure can be optimized by for example compressing a frame F with all the algorithms used, i.e. those that were in the negotiations found to be supported by both parties.

The frame F that is compressed with all the algorithms employed is preferably the first one representing a specific type of data, i.e. when the data type changes, the testing with the algorithms may be started from the beginning. The subsequent frames are each first compressed with the algorithm that at the previous frame yielded the best result. The other compression algorithms are not necessarily completed. Their processing may be interrupted immediately as the length of the compressed frame obtains the length of the algorithm compressed with the optimal algorithm.

According to another embodiment, a sliding average of the compression ratio is maintained-for each algorithm with which a frame has been compressed. The frames are compressed with different algorithms in an order determined by the compressing ratio obtained with the algorithms. If the compression ratio of a frame with some algorithm exceeds a predetermined threshold value, the frame in question will not be compressed with the other algorithms. The predetermined threshold value may be a fixed multiplier, for example a number between 3–6. Alternatively, the threshold value may be a specific percentage, for example 80–90% of the compression ratio achieved with the best algorithm up to that point.

If the time available is not sufficient for compressing each frame with each algorithm, the individual frames may be compressed for example with those 1–3 algorithms that up to that point show the best sliding average for the compression ratio. The remaining time—e.g. when waiting for the transmission turn—is spent on testing the remaining algorithms one at a time. This is illustrated by the following example. It is assumed that there are 7 different algorithms available, and when waiting for each transmission timeslot there is time to test four of them. In such a case, at each timeslot, compression may be carried out with those two algorithms that up to that point have yielded the best result. Of the other five algorithms, two are tested at each timeslot.

Encryption may further be improved if the algorithms are during the negotiation numbered in an order determined on the basis of a pseudorandom number known only to the parties. The same outcome may be reached by changing the identifiers of the algorithms at a specific algorithm during the connection. It is advantageous to carry out the negotiation in an encrypted form. With these methods the advantage is obtained that the compression algorithm identifiers transmitted along with the frames are not unequivocal to eavesdroppers.

FIGS. 2A and 2B illustrate some of the steps in the compression method of the invention. At step 200, the compression routine receives the data to be transmitted and compressed from the application producing them. Step 205 illustrates the operations in which time supervision is set to ensure that the data are transmitted on time, for example in the next transmission timeslot. At step 210, the header 1 of the frame F is compressed with an algorithm optimized for this purpose. At step 215, the data section 2 is compressed by a few, in this case three, of the best algorithms up to that point. In association with the compression, a parameter is maintained for each algorithm, illustrating its efficiency, such a parameter being for example the sliding average of the compression ratio. At step 220, the data section 2 is compressed with as many of the remaining algorithms as possible within the time supervision, in this example with two algorithms. The identifiers of the algorithms tested at this step are stored in memory, and next time at step 220, other algorithms are tested. The testing may be begun with the algorithm that follows the one tested last. When the time supervision 225 expires, for example when a transmission turn approaches, the order from best to worst of the algorithms is updated at step 230, and the data are transmitted at step 235 compressed with the algorithm that produced the best result within the time available.

The preferred embodiment of the invention relates to compressing data on a communication link and particularly in a packet radio network. The invention is applicable for use in other types of telecommunication systems and in data processing systems which have at least one distinct bottleneck restricting the capacity of the entire system. Therefore, it is obvious for a person skilled in the art that upon advancements in technology the basic idea of the invention may be implemented in many ways. The invention and its embodiments are consequently not restricted to the examples described above but they may vary within the scope of the claims.

References

[1] V. Jacobson: Compressing TCP/IP headers for low-speed serial links (Request For Comments 1144).

What is claimed is:

1. A method for compressing and transmitting data on a connection between two parties in a telecommunication system comprising at least one slow transmission channel (Um), the method comprising:

assembling the data to be transmitted into frames (F) which contain at least a header section (1) and a data section (2), and compressing at least one section (1, 2) of at least some of the frames (F) prior to transmission, making at least two different compression algorithms available to the transmitting party, making at least two different decompression algorithms available to the receiving party, characterized in that the transmitting party:

compresses at least one section (1, 2) of at least some of the frames (F) with at least two different compression algorithms;

selects the compression algorithm that yielded the best compression ratio; and transmits the frame (F) over the slow transmission channel (Um) to the receiving party, compressed with said selected compression algorithm.

2. A method as claimed in claim 1, characterized in that the parties negotiate the compression algorithms to be used on the connection at least at the beginning of the connection.

3. A method as claimed in claim 2, characterized by the first party sending to the second party an inquiry concerning the available algorithms, to which the second party responds by sending a list containing information on the algorithms available to the second party.

4. A method as claimed in claim 2, characterized by the second party selecting the algorithms that both the parties support from the list sent by the first party.

5. A method as claimed in claim 2, characterized by the second party transmitting a list of the algorithms available to it regardless of which algorithms the first party has available.

6. A method as claimed in claim 2, characterized by the first party transmitting a brief test message compressed separately with each algorithm being tested, and the second party responding with an affirmative acknowledgment if it is capable of decompressing the message, and if not, with a negative acknowledgment.

7. A method as claimed in claim 2, characterized in that both parties have a decompression algorithm available for substantially each compression algorithm.

8. A method as claimed in claim 2, characterized in that at least one of the parties may have available a decompression algorithm without a corresponding compression algorithm or vice versa, and that the parties negotiate separately the compression and decompression algorithms available to them.

9. A method as claimed in claim 2, characterized in that the negotiation between the parties is transmitted on an encrypted channel.

10. A method as claimed in claim 2, characterized in that the identifiers of the compression algorithms are changed between successive connections and/or during one connection.

11. A method as claimed in claim 1, characterized by
compressing the header sections (1) of the frames (F) with an algorithm which is substantially the same between two successive frames (F), and
compressing the data sections (2) of the frames (F) with at least two different algorithms of which the one is selected that yields the best compression result.

12. A method as claimed in claim 1, characterized by transmitting, with each compressed frame (F), an identifier indicative of the compression algorithm used.

13. A method as claimed in claim 1, characterized in that when the compression algorithm changes the transmitting party separately transmits information on the change to the receiving party.

14. A method as claimed in claim 1, characterized by
compressing a frame (F), which is advantageously the first one representing a specific type of data, with substantially all the algorithms known to both parties,
compressing the subsequent frames (F) first with the algorithm that at the previous frame (F) produced the best result,
discontinuing to carry out the other algorithms if the length of the frame (F) compressed with the algorithm in question exceeds the length of the frame (F) compressed with up to that point the best algorithm.

15. A method as claimed in claim 1, characterized by the transmitting party being assigned a restricted time for the compression, such as the time between two successive transmit turns in time division multiple access systems.

16. A method as claimed in claim 15, characterized in that at the end of the restricted time the transmitting party discontinues testing the compression algorithms and transmits the frame (F) compressed with the algorithm that up to that point has yielded the best compression result.

17. A method as claimed in claim 16, characterized by
maintaining, for the different compression algorithms, a parameter indicating efficiency, advantageously a sliding average of the compression ratio,
compressing each frame (F) or a section (1, 2) thereof with a few, advantageously 1–3 of the best compression algorithms up to that point, in an order determined by the parameter indicating efficiency, and
testing, in the remaining part of the restricted time, the remaining algorithms alternately so that at successive frames (F) different algorithms are tested.

* * * * *